United States Patent
Sasaki et al.

(10) Patent No.: US 7,582,491 B2
(45) Date of Patent: Sep. 1, 2009

(54) METHOD FOR DIAGNOSING ELECTROSTATIC CHUCK, VACUUM PROCESSING APPARATUS, AND STORAGE MEDIUM

(75) Inventors: Yasuharu Sasaki, Nirasaki (JP); Taketoshi Okajo, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 152 days.

(21) Appl. No.: 11/925,190

(22) Filed: Oct. 26, 2007

(65) Prior Publication Data
US 2008/0102209 A1 May 1, 2008

Related U.S. Application Data

(60) Provisional application No. 60/883,861, filed on Jan. 8, 2007.

(30) Foreign Application Priority Data
Oct. 27, 2006 (JP) ............................. 2006-293040

(51) Int. Cl.
*H01L 21/66* (2006.01)
(52) U.S. Cl. ....................................... 438/14
(58) Field of Classification Search ................. None
See application file for complete search history.

(56) References Cited

U.S. PATENT DOCUMENTS 6,077,357 A * 6/2000 Rossman et al. ............ 118/728
6,390,019 B1 * 5/2002 Grimbergen et al. ..... 118/723 R
6,853,953 B2 2/2005 Brcka et al.
2003/0033116 A1 2/2003 Brcka et al.
2006/0219360 A1 10/2006 Iwasaki
2007/0084847 A1 * 4/2007 Koshimizu et al. .......... 219/390

FOREIGN PATENT DOCUMENTS

JP 2003-133404 5/2003
KR 10-2006-0106736 10/2006

* cited by examiner

*Primary Examiner*—Charles D. Garber
*Assistant Examiner*—Andre' C Stevenson
(74) *Attorney, Agent, or Firm*—Oblon, Spivak, McClelland, Maier & Neustadt, P.C.

(57) ABSTRACT

A method for diagnosing temporal deterioration of temperature controlling performance of an electrostatic chuck includes the steps of performing vacuum processing on the substrate wherein the substrate is adsorbed by the electrostatic chuck while a temperature control gas for controlling a temperature of the substrate is supplied between the substrate and the electrostatic chuck, and exposing, during the above step, a substrate absorbed by the electrostatic chuck to an atmosphere generated by using a processing recipe for diagnosis, detecting a temperature of the substrate. A pressure of the temperature control gas is controlled such that the detected temperature becomes a specific temperature, and the controlled pressure is stored in a storage unit. The method further includes a step of diagnosing the deterioration of the temperature controlling performance of the electrostatic chuck based on the pressure of the temperature control gas stored in the storage unit.

16 Claims, 12 Drawing Sheets

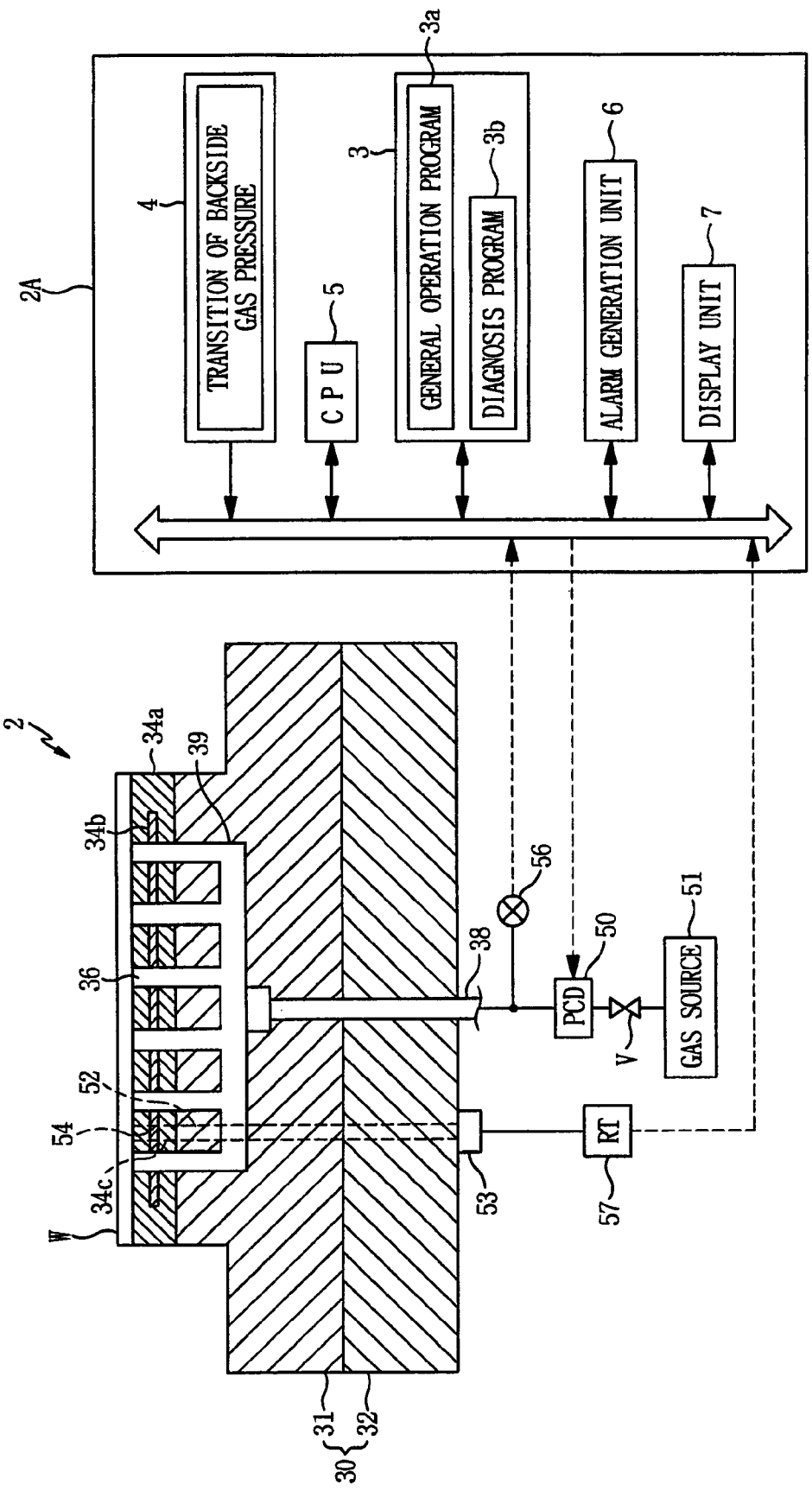

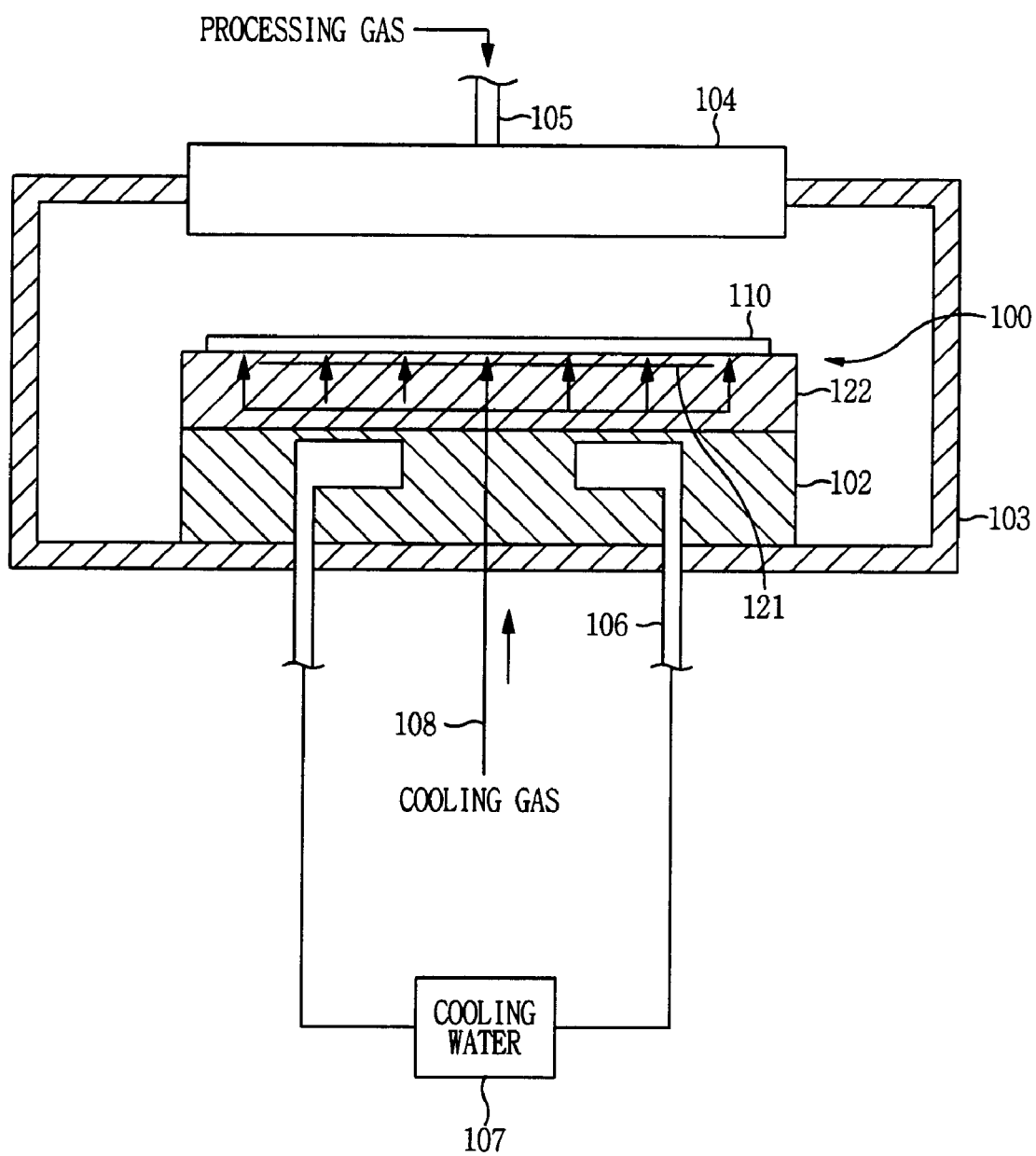

METHOD FOR DIAGNOSING ELECTROSTATIC CHUCK, VACUUM PROCESSING APPARATUS, AND STORAGE MEDIUM

FIELD OF THE INVENTION

The present invention relates to technology for diagnosing a temporal variation in the temperature control performance of an electrostatic chuck employed when performing a vacuum processing on a substrate.

BACKGROUND OF THE INVENTION

In a vacuum processing apparatus that carries out a vacuum processing, such as etching or chemical vapor deposition (CVD), vacuum cannot be used for holding a substrate on a mounting table. Further, in order to prevent the substrate from being damaged (scratched, bent or the like.) by a mechanical chuck, an electrostatic chuck is generally used.

For example, as shown in FIG. 11, an electrostatic chuck 100 is provided on the surface of the mounting table 102 in a vacuum processing vessel 103 and includes a dielectric material 122 and a sheet of an electrode 121 embedded therein the dielectric material 122. The electrode 121 is connected with a power supply (not shown). By applying a voltage to the electrode 121, the electrostatic chuck 100 is adapted to adsorb the substrate 110 mounted thereon by electrostatic force.

A gas shower head 104 is provided on top of the electrostatic chuck 100. A processing gas supplied from a gas supply line 105 is converted into a plasma between the gas shower head 104 and the mounting table 102 by a high frequency power supplied from the power supply (not shown). As a result, the substrate 110 is etched.

During an etching process, the temperature of the substrate 110 is increased by, e.g., heat applied from the plasma. Hence, by circulating a coolant, e.g., cooling water of a coolant source 107, through a coolant channel 106 provided in the mounting table 102, the substrate 110 can be maintained at a processing temperature, of, e.g., tens of degrees due to the balance between the heat applied from the plasma and heat transferring to the mounting table 102 (cooling by the mounting table 102). Further, since the surface of the electrostatic chuck 100 is uneven on a microscopic scale, cooling gas (so-called backside gas), i.e., temperature control gas, is supplied through a gap between the substrate 110 and the electrostatic chuck 100, so that the heat of the substrate 110 is dissipated toward the electrostatic chuck 100 via the cooling gas.

However, when the electrostatic chuck 100 is repeatedly used, i.e., when the number of processed substrates 100 is increased, the surface of the dielectric material 122 becomes worn by contacting with the substrate 110, thereby becoming smooth, as shown FIG. 12A. As such, the contact area with the substrate 110 increases from S1 to S2. For this reason, the amount of heat transferred from the substrate 110 to the electrostatic chuck 100 through this contact portion is increased, so that the temperature of the substrate 110 is gradually decreased, as shown FIG. 12B. The temperature change may become considerably large, particularly in a process in which the pressure of the cooling gas is low. Since the temperature of the substrate 110 has a some margin with respect to the processed state of the substrate 110, the temperature of the substrate 110 is set to be a specific temperature by controlling the flow rate of the coolant or the like at the side of the mounting table 102 when the electrostatic chuck 100 begins to be used, and then continues to be used without change generally.

However, if the temperature of the substrate 110 is greatly decreased, e.g., about 10° C. to 15° C., a defect may occur on a lot bases, and thus it is necessary to predict the residual life span of the electrostatic chuck 100. Further, since the cooling gas is a part of the heat transfer media between the substrate 110 and the electrostatic chuck 100, the temperature reduction of the substrate 110 can be suppressed by reducing the pressure of the cooling gas. However, if the surface of the electrostatic chuck 100 is worn, the heat transfer rate through the contact portions with the substrate 110 is high. In such a case, therefore, the temperature of the substrate 110 may not be changed a lot by the pressure change of the cooling gas. As a result temperature regulation based on the cooling gas is not effective, and thus is not carried out.

Two types of electrostatic chuck are known, one of which is a Johnson Rahbek type (hereinafter referred as a "JR type"), which adsorbs the substrate by using the electrostatic force generated between the substrate and the surface of the electrostatic chuck, and the other is a Coulombic type, which adsorbs the substrate 110 by using the electrostatic force generated between the substrate and the electrode. In the JR type electrostatic chuck, the electric current flowing through the electrode is high, and adsorptive force is unstable. In contrast, the Coulombic type electrostatic chuck has a low electric current value and stable adsorptive force. Hence, the Coulombic type electrostatic chuck is more frequently used. In the JR type electrostatic chuck, a temporal variation in the electric current value caused by the increase in the contact area is great, so that the electric current value can be used as the index of the life span. On the contrary, in the Coulombic type electrostatic chuck, such a temporal variation in the electric current value is small, and thus the electric current value cannot be used as the index of the residual life span of the electrostatic chuck.

Further, in the actual plasma processing apparatus, a plurality of processing recipes, and setting temperatures for the substrate are prepared. In addition, the margins of the setting temperature are not various. Therefore, the temperature of the substrate cannot be employed as the index of the residual life span.

Japanese Patent Laid-open Application No. 2003-133404 (especially para.0027 and FIG. 8) discloses a technology for predicting the characteristics of the electrostatic chuck prior to the use thereof. However, the index used therein is a current, voltage or the like, so that the residual life span of the electrostatic chuck cannot be predicted while the electrostatic chuck is in use. Thus, the aforementioned problem cannot be solved.

SUMMARY OF THE INVENTION

In view of the above, the present invention provides a method for diagnosing a temporal variation in the temperature control performance of an electrostatic chuck, a vacuum processing apparatus, and a storage medium for storing a computer program executing the diagnosing method.

In accordance with an aspect of the present invention, there is provided A method for diagnosing temporal deterioration of temperature controlling performance of an electrostatic chuck which is provided on a mounting table in a vacuum vessel and absorbs a substrate with an electrostatic force, the method including the steps of: (a) performing vacuum processings, wherein each vacuum processing is performed on a substrate absorbed by the electrostatic chuck, while a temperature control gas for controlling a temperature of the substrate is supplied between a rear surface of the substrate and a surface of the electrostatic chuck; (b) exposing, during the step (a), a substrate absorbed by the electrostatic chuck to an atmosphere generated by using a processing recipe for diagnosis, detecting a temperature of the substrate wherein, a pressure of the temperature control gas is controlled such that the detected temperature becomes a specific temperature, and the controlled pressure of the temperature control gas is stored in a storage unit; and (c) diagnosing the deterioration of the temperature controlling performance of the electrostatic chuck based on the pressure of the temperature control gas stored in the storage unit.

The step (b) may be repeatedly performed during the step (a).

The step (c) may be preferably performed based on sequential pressure data the temperature control gas obtained by the repeatedly performed step (b).

The step (c) may include a step of determining whether or not the controlled pressure of the temperature control gas is less than a threshold value.

The substrate, to which the processing recipe for diagnosing is applied, may be a substrate for maintenance.

The temperature of the substrate may be detected by a temperature detection unit provided at the mounting table.

The substrate employed in the step (b) may include a temperature detection unit detecting the temperature of the substrate.

The detected temperature by the temperature detection unit may be obtained after the substrate is unloaded from the vacuum vessel, and if the obtained temperature of the substrate is different from the specific temperature, newly detected temperature of the substrate is obtained by changing the pressure of the temperature control gas and exposing the substrate to the atmosphere generated by using the processing recipe for diagnosis again.

The vacuum processing may use a plasma processing.

The surface of the electrostatic chuck may be formed by polishing thermally sprayed power of a dielectric material.

The surface of the electrostatic chuck may include an annular protrusion which has almost same diameter as that of the substrate mounted on the electrostatic chuck and a plurality of columnar bodies surrounded by the protrusion and having the same height as the protrusion, so that the backside gas flows between the columnar bodies surrounded by the protrusion.

In accordance with another aspect of the present invention, there is provided a vacuum processing apparatus which performs a vacuum processing on a substrate absorbed by an electrostatic chuck provided on a mounting table in a vacuum vessel, while a temperature control gas for controlling a temperature of the substrate is supplied between a rear surface of the substrate and a surface of the electrostatic chuck.

The vacuum processing apparatus includes: a temperature detection unit for detecting the temperature of the substrate; a pressure detection unit for detecting a pressure of the temperature control gas; a pressure control unit for controlling the pressure of the temperature control gas; a storage unit for storing detected pressure values from the pressure detection unit;

The vacuum processing apparatus further includes executing unit, being executed between the vacuum processing, which is performed sequentially on a plurality of substrates, for exposing the substrate absorbed by the electrostatic chuck to an atmosphere generated by using a processing recipe for diagnosis, detecting a temperature of the substrate, wherein a pressure of the temperature control gas is controlled such that the detected temperature at the temperature detection unit becomes a specific temperature and the controlled pressure from the pressure detection unit is stored in a storage unit, and a diagnosing unit for diagnosing deterioration of temperature controlling performance of the electrostatic chuck based on the detected pressure of the temperature control gas stored in the storage.

The substrate, to which the processing recipe for diagnosing is applied, may be a substrate for maintenance.

The diagnosing unit may diagnose the deterioration of the temperature controlling performance of the electrostatic chuck based on sequential pressure data of the temperature control gas obtained during the vacuum processing.

The diagnosing unit may include means for determining whether or not the pressure of the temperature control gas is less than a threshold value.

The present invention provides a storage medium, which stores a program used in a vacuum processing apparatus performing vacuum processing on a substrate while the substrate is absorbed by an electrostatic chuck provided on a mounting table in a vacuum vessel, wherein the program includes steps of performing the method for diagnosing the electrostatic chuck described above.

In accordance with the aspects of the present invention, when supplying the temperature control gas between the substrate and the electrostatic chuck to maintain the substrate at a specific temperature and performing vacuum processing on the substrate, the pressure value of the temperature control gas, which is required to maintain the substrate at a predetermined temperature, is monitored. The monitored pressure value is compared with the predetermined pressure value, to diagnose the temperature control performance of the electrostatic chuck. Hence, appropriate measures can be performed before the end of life span of the electrostatic chuck, and it is possible to inhibit adverse influences on substrate processing caused by a temperature change of the substrate.

BRIEF DESCRIPTION OF THE DRAWINGS

The objects and features of the present invention will become apparent from the following description of embodiments given in conjunction with the accompanying drawings, in which:

FIG. 3 is a diagram showing an exemplary of a control unit in accordance with a first embodiment of the present invention;

FIG. 11 is a vertical cross sectional view showing a conventional well-known vacuum processing apparatus.

DETAILED DESCRIPTION OF THE EMBODIMENTS

Figure 1:
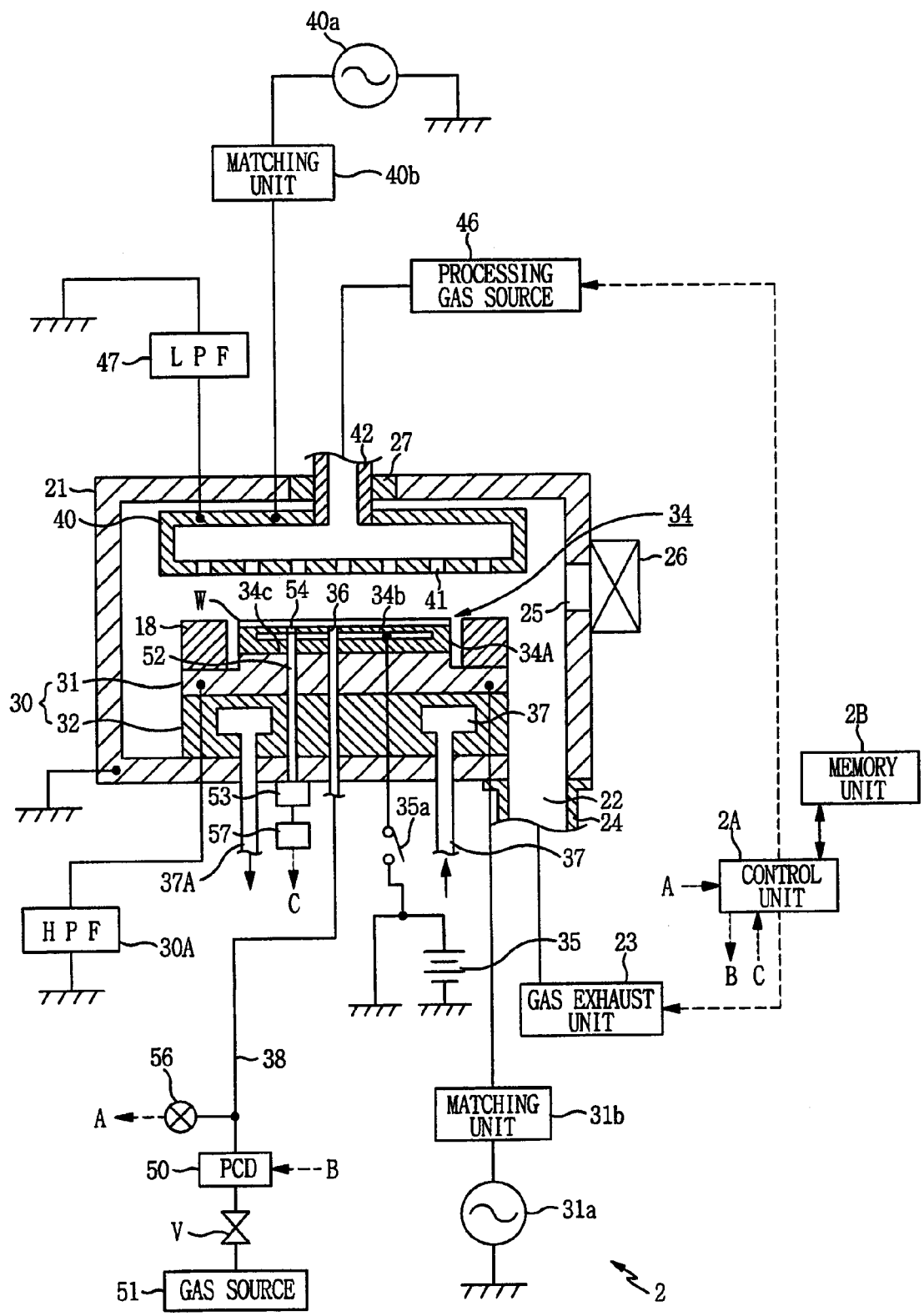
FIG. 1 is a vertical cross sectional view showing an exemplary a vacuum processing apparatus of the present invention.

Hereinafter, embodiments of the present invention will be described with reference to the accompanying drawings that form a part hereof. In the drawings, like parts are designated by like reference numerals.

First Embodiment

The first embodiment for performing a diagnosis method of an electrostatic chuck in accordance with the present invention will be described with reference to FIGS. 1 through 3. The vacuum processing apparatus shown in FIG. 1 is, e.g., an apparatus that performs a plasma processing on a wafer W, and includes a processing vessel 21, such as a airtightly sealed vacuum vessel, a mounting table 30 disposed at the center of the bottom of the processing vessel 21, and an upper electrode 40 provided above the mounting table 30 to be faced therewith.

The processing vessel 21 is electrically grounded. Further, the bottom wall of the processing vessel 21 is provided with an exhaust port 22, to which a gas exhaust unit 23 is connected via a gas exhaust line 24. The gas exhaust unit 23 is connected with a pressure control unit, which is not shown. This pressure control unit is adapted to evacuate the processing vessel 21 and keep the processing vessel 21 at a desired vacuum level in response to a signal from a control unit 2A, which will be described later. The processing chamber 21 is provided with a transfer port 25 for the wafer W at a sidewall thereof, and the transfer port 25 can be opened and closed by a gate valve 26.

The mounting table 30 includes a lower electrode 31 and a support body 32 supporting the underside of the lower electrode 31. A coolant reservoir 37 is formed in the support body 32 as a temperature control unit that maintains a temperature control fluid, that is, a coolant. The coolant flows between the exterior and the coolant reservoir 37 through a supply line 37a and a discharge line 37b, so that the body portion of the mounting table 30 is cooled to a preset reference temperature, e.g., 20° C. An electrostatic chuck 34 is provided on top of the mounting table 30. The wafer W is mounted on the mounting table 30 via the electrostatic chuck 34. The electrostatic chuck 34 is made up of an insulating material (dielectric) 34a and an electrode foil 34b buried therein. The electrode foil 34b is connected to a high voltage DC power supply 35 via a switch 35a. By switching the switch 35a from the ground to the high voltage DC power supply 35, and thus applying voltage from the high voltage DC power supply 35 to the electrode foil 34b, static electricity is generated between the electrode foil 34b and the lower surface of the wafer W mounted on the electrostatic chuck 34. Therefore, the wafer W mounted on the mounting table 30 is electrostatically adsorbed to the electrostatic chuck 34.

Figure 2:
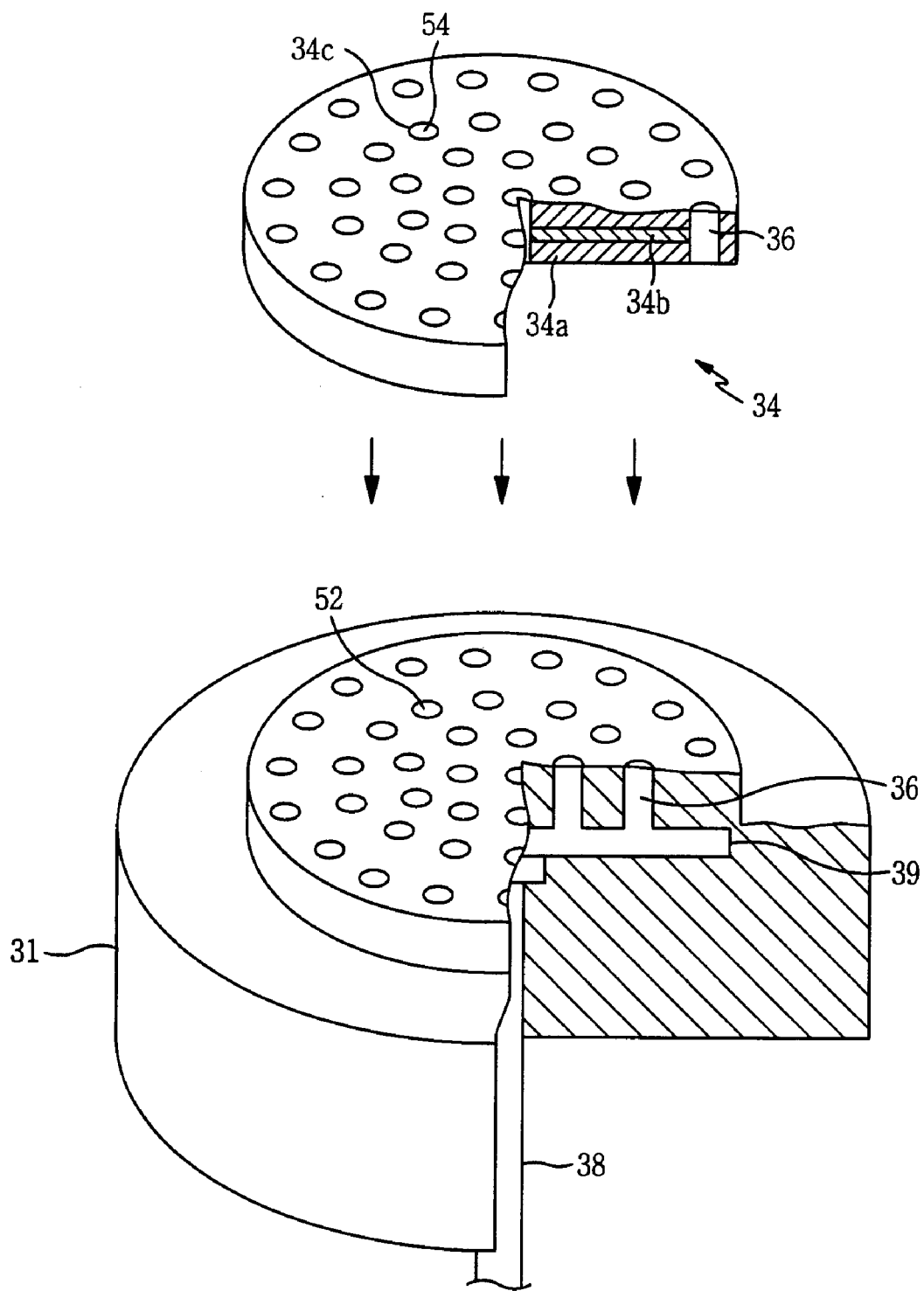
FIG. 2 is a perspective view showing one example of an electrostatic chuck in accordance with the present invention.

As shown in FIG. 2, a flat gas chamber 39 is formed in the lower electrode 31. The gas chamber 39 is connected with a gas supply line 38, which supplies a thermally conductive gas, e.g., helium (He) gas as temperature control gas, and passes through the bottom of the processing vessel 21. Hereinafter, the temperature control gas will be referred to as "backside gas". The gas chamber 39 is provided, at the top surface thereof, with a plurality of through holes 36, which are opened to the top surface of the electrostatic chuck 34. The backside gas delivered from the gas supply line 38 to the gas chamber 39 is supplied to the gap between the wafer W and the electrostatic chuck 34 via the through holes 36. The heat supplied from the plasma to the wafer W is transferred to the cooled mounting table 30 through the backside gas. Further, some parts, such as the gas chamber 39 and the through holes 36, are not depicted in FIG. 1 for simplifying the illustration.

The gas supply line 38 has a base end connected to a temperature control gas source 51 via a valve V and a pressure control device (PCD) 50 having a pressure control valve serving as a pressure control unit. Further, the gas supply line 38 is provided with a pressure detection unit 56, which detects the pressure of gas regulated by the pressure control device 50.

Further, an infrared passage 52 is formed to pass through the mounting table 30 and the bottom of the processing vessel 21, and the electrostatic chuck 34 is also provided with a through hole 34c at a position corresponding to the infrared passage 52, the through hole 34c serving as a part of the infrared passage 52. Further, the upper end (the wafer W side) of the infrared passage 52 in the mounting table 30 is provided with a transmission window 54 serving as an airtightly seal between the inner space of the processing vessel 21 and the outside of the infrared passage 52. A detection end 53 of a radiation thermometer 57, i.e., a temperature detection unit, which receives infrared radiation from the infrared passage 52, is provided outside the processing vessel 21. The infrared radiation, which radiates from the rear surface of the wafer W, passes through the infrared passage 52, and is then received by the detection end 53. Therefore, the temperature of the wafer W is detected by the radiation thermometer 57, and then the detected temperature is sent to a control unit 2A, which will be described later. Further, in the embodiment of the present invention, the infrared passage 52 is implemented as a simple cavity. However, the infrared passage 52 may be implemented by, e.g., an optical fiber, through the interior of which the infrared radiation can propagate.

The lower electrode 31 is grounded via a high pass filter (HPF) 30a, and is connected with a second RF power supply 31a via a matching unit 31b, the second RF power supply 31a serving as a bias RF power supply. Further, a focus ring 18 is disposed around the outer circumference of the lower electrode 31 to surround the electrostatic chuck 34. Thus, when generated, plasma converges on the wafer W on the mounting table 30 via the focus ring 18.

The upper electrode 40 is formed in a hollow form, and provided with a plurality of holes for evenly supplying a processing gas into the processing vessel 21 at the bottom surface thereof in a uniformly distributed arrangement. That is, the upper electrode 40 is configured as a gas shower head. Further, a gas inlet line 42 is provided at the center of the upper surface of the upper electrode 40. The gas inlet line 42 passes through the center of the top surface of the processing vessel 21 via an insulating member 27. The gas inlet line 42 is coupled to a processing gas source 46, which functions to supply gas for processing the wafer W, via a valve and a flow controller, which are not shown.

The upper electrode 40 is grounded via a low-pass filter (LPF) 47, and is connected with a first RF power supply 40a, which supplies a frequency higher than that of the second RF power supply 31a via a matching unit 40b. The high frequency power from the RF power supply 40a connected to the upper electrode 40 functions to convert the processing gas into a plasma. The high frequency power from the first RF power supply 31a connected to the lower electrode 31 functions to apply a bias power to the wafer W and thereby attracting ions of the plasma to the surface of the wafer W. The RF power supplies 40a and 31a are connected to the control unit 2A, and the powers supplied to the upper and lower electrodes 40 and 31 are controlled on the basis of control signals therefrom.

Further, as shown in FIG. 3, the vacuum processing apparatus 2 includes the control unit 2A serving to diagnose the electrostatic chuck 34 and implemented by, e.g., a computer. The control unit 2A has a program 3, storage unit 4, and a CPU 5.

The program 3 includes a general operation program 3a, which carries out the plasma processing on the wafer W, and a diagnosis program 3b that diagnoses a temporal variation in the temperature control performance or function of the electrostatic chuck 34 and, in other words, predicts the residual life span of the electrostatic chuck 34.

The general operation program 3a includes recipes for performing various types of processing on the wafer W, and performs the plasma processing on the wafer W by controlling the species or flow rate of the processing gas, as well as the voltage, frequency and the like of the RF power supplies 40a and 31a on the basis of the recipes. Further, as described later, the general operation program 3a may be applied to measure the temperature of the wafer W being plasma processed by using the radiation thermometer 57, and allow the pressure of the backside gas to be controlled by the pressure control device 50, so that the measured temperature is set to be the processing temperature indicated by the recipe.

The diagnosis program 3b is a program that executes a recipe for diagnosis, which will be described later, or serves to predict the residual life span of the electrostatic chuck 34. The diagnosis program 3b is a program of regular maintenance, which is executed after executing the general operation program 3a for predetermined times. Further, the term "diagnosis (prediction of residual life span)" used herein refers to predicting that the temperature of the wafer W can no longer be maintained at the predetermined temperature in the near future by controlling the pressure of the backside gas, that is, determining whether or not the end of the life span of the electrostatic chuck 34 is near.

Figure 4A:
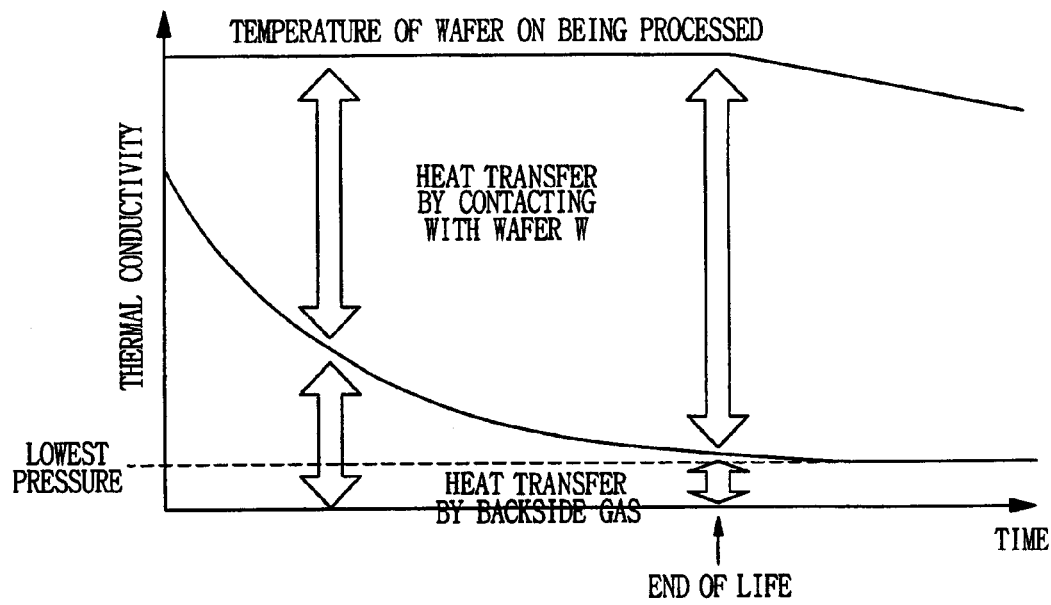
FIGS. 4A and 4B are a view illustrating a method for predicting a residual life span of an electrostatic chuck in the present invention.
Figure 12A:
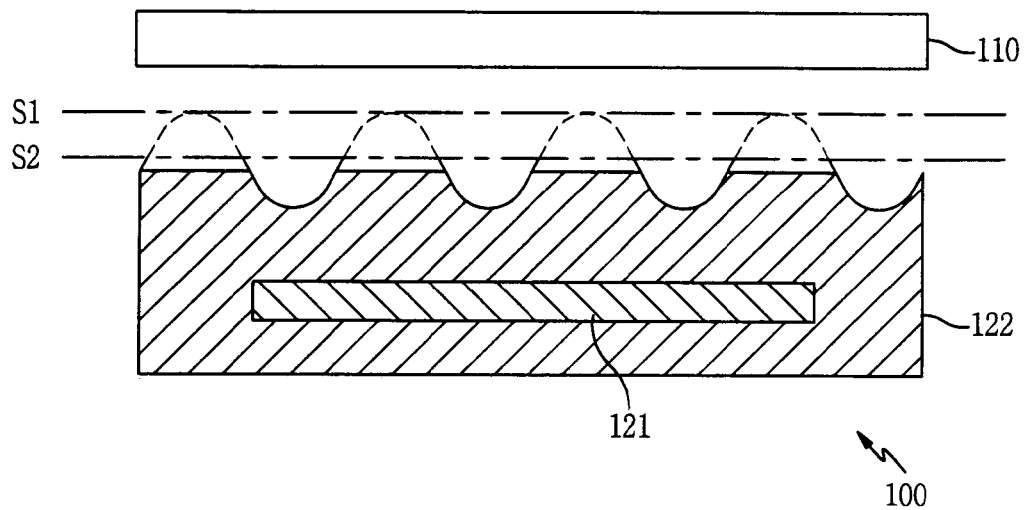
FIGS. 12A and 12B are a view illustrating a cause of deterioration of an electrostatic chuck.

The diagnosis program 3b will now be described in more detail. As described above, since the surface of the electrostatic chuck 34, on which the wafer W is electrostatically attracted, becomes smoothed by friction with the wafer W as an increase of the usage time (the number of processed wafers W), as shown in FIG. 12A, the contact area with the wafer W is gradually increased. Further, the wafer W exchanges heat with the electrostatic chuck 34 by physical contact and the backside gas flowing through the gap therebetween, and thermal conduction becomes larger as the physical contact becomes larger due to the increase in the number of processed wafers W. Therefore, as shown in FIG. 4A, the pressure control device 50 is controlled such that the temperature of the wafer W is kept constant (the pressure (flow rate) of the backside gas is gradually decreased). However, when the pressure of the backside gas reaches a certain low-pressure level, it is difficult to stably control the pressure of the backside gas. For this reason, the time when a critical (lower limit) pressure capable of stably controlling the pressure of the backside gas amounts to, for example, 5 Torr (666.6 Pa) is determined as the end of the life span of the electrostatic chuck 34.

Figure 12B:
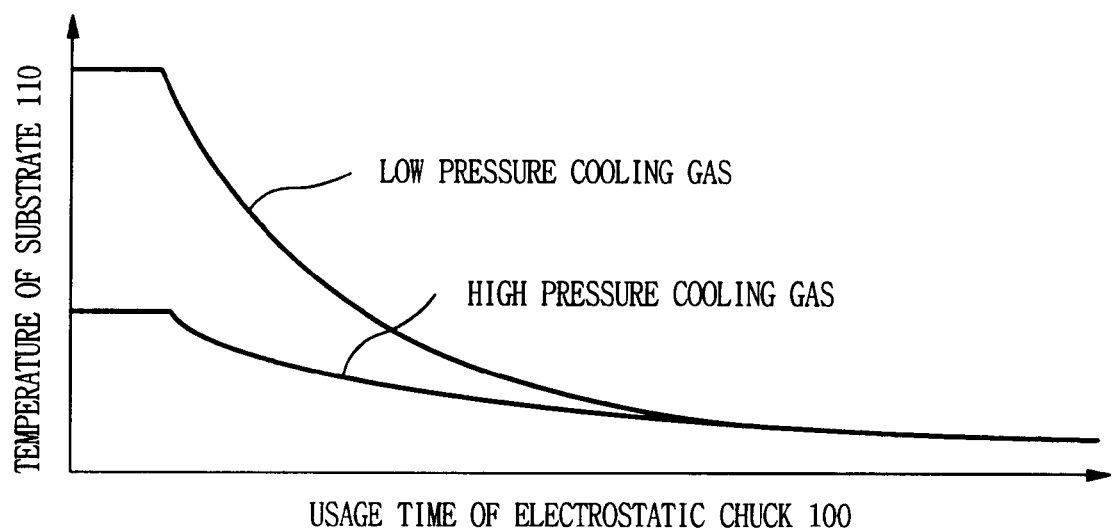

If the electrostatic chuck 34 continues to be used beyond its life span, the thermal conduction caused by the contact of the wafer W with the electrostatic chuck 34 is increased, and thus the temperature of the wafer W being processed cannot be controlled as prescribed by the recipe. As a result, the temperature of the wafer W is gradually decreased, and thus exerts an influence on the process. As shown in FIG. 12B, which has been described above, the decrease of the temperature is remarkable in a process in which the pressure of the backside gas is low (i.e. a process having a higher heat exchange rate due to physical contact between the wafer W and the electrostatic chuck 34 than the heat exchange rate between the wafer W and the backside gas). In a process having a high pressure of the backside gas, the decrease of the temperature can be gentle. However, because there exists a limit in the heat exchange between the backside gas and the wafer W (diffusion velocity of molecules in the gas), i.e., there exist a direct contact between electrostatic chuck 34 and wafer W, the decrease of the temperature cannot be eliminated. This problem can occur in any process.

Further, in the various recipes executed by the general operation program 3a, the processing temperature may vary depending on the respective recipes and each lot of wafers W. Therefore, the data obtained by monitoring the pressure of the backside gas while executing the general operation program 3a can be too erroneous to be employed in predicting the performance of the electrostatic chuck 34. However by executing this diagnosis program 3b, high precision data, which represents the residual life span of the electrostatic chuck 34 can be obtained.

More specifically, the diagnosis program 3b performs a plasma processing on, e.g., a wafer W for maintenance (referred to as "maintenance wafer W" hereinafter) based on a specific recipe for diagnosis, measures the temperature of the wafer W, and simultaneously adjusts the opening degree of the pressure control device 50 for the backside gas (i.e., the pressure of the backside gas) so that the wafer W, which is being plasma processed, maintains the predetermined temperature set by the recipe for diagnosis. In other words, measuring the pressure of the backside gas under the fixed processing conditions for the wafer W, the thermal conductivity due to physical direct contact between the electrostatic chuck 34 and the wafer W being plasma processed, that is, the surface state of the electrostatic chuck 34 can be monitored.

The pressure value of the backside gas after regulation is stored in the storage unit 4.

Since the number of pressure values of the backside gas stored in the storage unit 4 is increased, for instance, by regularly performing the diagnosis using the diagnosis program 3b, a transition (temporal variation) of the pressure of the backside gas can be obtained, as shown in FIG. 4A. Since transition of the pressure of the backside gas is easily approximated by a quadratic function, for example the residual life span of the electrostatic chuck 34 can be predicted in advance, before the electrostatic chuck 34 reaches the end of its life span.

The diagnosis program 3b generates an alarm from, e.g., an alarm generation unit 6, or outputs a message urging the exchange of the electrostatic chuck 34 to a display unit 7 when the life span of the electrostatic chuck 34 is determined to be about to be ended on the basis of the transition of the pressure of the backside gas (i.e., if the backside gas pressure reaches a threshold value). Further, the time when the life span of the electrostatic chuck 34 expires may be constantly displayed on the display unit 7 all the time.

Further, the diagnosis program 3b may be automatically executed whenever the general operation program 3a is executed for predetermined times, or may be executed any time by an operator.

These programs 3a and 3b (including an program for inputting or displaying processing parameters) may be stored in a memory unit 2B such as a computer storage medium, for example, a flexible disc, a compact disc, or a magneto-optical (MO) disc, and then installed in the control unit 2A.

Next, operations of the diagnosis method of the electrostatic chuck 34 in accordance with an embodiment of the present invention using the vacuum processing apparatus 2 will be described.

First, in the vacuum processing apparatus 2, the plasma processing based on the general operation program 3a is performed on the wafer W for device production (referred to as "product wafer" hereinafter). The detailed steps of the plasma processing are omitted, because they are identical to those of the diagnosis program 3b, except the temperature measuring process of step S54, which will be described below. On the basis of various recipes of the general operation program 3a, the plasma processings, i.e., the vacuum processings, such as etching, are continuously performed on a plurality of wafers W for device production. Then, the processing by the diagnosis program 3b is performed by the following steps. Further, the general operation program 3a may include the step S54 to thereby correcting the temperature of the wafer W.

(Step S51: Load Maintenance Wafer W)

First, the gate valve 26 is opened and the wafer W is loaded into the processing vessel 21 by using a transfer mechanism (not shown). The wafer W is horizontally mounted on the mounting table 30, and then the wafer W is electrostatically adsorbed on the mounting table 30 by switching the switch 35a to the high voltage DC power supply 35. Thereafter, the transfer mechanism is withdrawn from the processing vessel 21, and the gate valve 26 is closed.

(Step S52: Regulate Temperature of Wafer W)

Subsequently, the backside gas is supplied from the gas supply line 38 via the through holes 36.

(Step S53: Perform Plasma Processing)

The processing vessel 21 is evacuated through the gas exhaust line 24 by the gas exhaust unit 23, and is maintained at a predetermined vacuum level. Then, the processing gas is supplied from the processing gas source 46 into the processing vessel 21. Thereafter, the first RF power is applied to the upper electrode 40, and thus the processing gas is converted into a plasma. The second RF power is also applied to the lower electrode 31 to induce the plasma ions on the wafer W. Therefore, the wafer W is the plasma processed. Since this plasma processing is directed to maintenance, argon (Ar) gas, $C_5F_8$ gas or a mixture of Ar gas and $O_2$ gas can be used as a processing gas for example.

(Step S54: Measure Temperature of Wafer W)

During the plasma processing, the temperature of the wafer W is increased by the heat applied from the plasma. Meanwhile, since the wafer W is cooled by the electrostatic chuck 34 (thermal conduction by the contact with the electrostatic chuck 34, and thermal convection by the backside gas), the temperature of the wafer W is changed to reach an equilibrium temperature by the balance of heat input and heat loss. At this time, the temperature of the wafer W is detected by the radiation thermometer 57 via the infrared radiation, which radiates along the infrared passage 52 in a downward direction.

Then, the pressure of the backside gas is controlled by the pressure control device 50 so that the detected value of the temperature of the wafer W becomes the value of a predetermined temperature. Further, although this process regulates the pressure of the backside gas so that the temperature of the wafer W becomes the predetermined temperature, e.g., through Proportional Integral Derivative (PID) control, the worker may control the pressure of the backside gas (the pressure control device 50) by monitoring the temperature of the wafer W.

(Step S55: Record Pressure of Backside Gas)

The pressure of the backside gas, which is controlled in step S54, is recorded in the storage unit 4.

(Step S56: Terminate Plasma Processing)

Subsequently, the supply of power from the RF power supplies 40a and 31a is stopped, and the generation of the plasma in the processing vessel 21 is stopped. Further, the supply of the processing gas from the processing gas source 46 is stopped. The processing vessel 21 is evacuated by the gas exhaust unit 23, and thereby the remaining gas is eliminated. Then, the wafer W is unloaded from the processing vessel 21.

(Step S57: Predict End of Life Span of Electrostatic Chuck 34)

As described above, by repeating the diagnosis program 3b for predetermined times, the recorded data of the pressure of the backside gas in step S55 is accumulated. Accordingly, the transition of the pressure of the backside gas can be obtained. The residual life span of the electrostatic chuck 34 is predicted from the transition of the pressure of the backside gas. That is, the transition of the pressure of the backside gas in the near future is predicted by an approximation equation of the pressure of the backside gas obtained from the accumulated pressure data. When the residual life time of the electrostatic chuck 34 is less than a specific value (when the end of the life span of the electrostatic chuck 34 is near), the alarm or the message prompting the exchange of the electrostatic chuck 34 is provided as described above.

The predicted end of the life span of the electrostatic chuck 34 may have a great error when a small amount of data is recorded at the step S55. However, as the amount of recorded data increases, the accuracy increases.

In accordance with the embodiment of the present invention described above, the diagnosis program 3b records the temporal variation of the pressure of the backside gas supplied to the gap between the electrostatic chuck 34 and the wafer W in order to maintain the temperature of the wafer W at the predetermined temperature, so that the residual life span of the electrostatic chuck 34 can be predicted on the basis of the temporal variation. Therefore, the reduction in the yield of the wafer W due to the abnormal temperature can be prevented by the abnormal temperature by using a simple method. Further, the residual life span of the electrostatic chuck 34 can be monitored continuously, so that a long-term purchase plan of the electrostatic chucks 34 can be established.

In this embodiment described above, the residual life span of the electrostatic chuck 34 is predicted by approximation equation obtained from the transition of the pressure of the backside gas. However, e.g., when data of the pressure has already been obtained (in case the electrostatic chuck 34 has been previously exchanged several times), the residual life span of the electrostatic chuck 34 can be obtained by a transition curve of the pressure of the backside gas previously, or a specific value can be set to be greater then a lower limit of the regulated pressure of the backside gas, and an alarm can be made when the pressure of the backside gas is less than the specific value. Further, an alarm can be made when the difference between pressure values of the backside gas (variation in the pressure of the backside gas), which have been obtained from two diagnosis programs 3b executed before and after a plurality of general operation programs 3a, is less than a threshold value.

As described above, the diagnosis program 3b is executed whenever the general operation program 3a is repeated for the product wafer W predetermined times. However, when the electrostatic chuck 34 is first used (is exchanged), the diagnosis program 3b may be executed to check the initial state of the electrostatic chuck 34, and then the general operation programs 3a may be executed. In other words, since individual electrostatic chucks 34 have minute differences, the minute individual differences can be checked (i.e. the differences between the electrostatic chuck 34 can be examined) by the diagnosis program 3b when the electrostatic chuck 34 is exchanged. Further, by checking these initial states, the amount of data about the transition of the pressure of the backside gas is increased, so that the prediction of the residual life span can be made more reliable, and the reduction yield due to initial failure of the electrostatic chuck 34 can be prevented.

In this embodiment, the infrared radiating from the wafer W is detected by the radiation thermometer 57 in order to measure the temperature of the wafer W being plasma processed. However, a fluorescence thermometer detecting the luminance reduction of a fluorescent body depending on the temperature may be employed for example. The light emitting time of the fluorescent body is greatly influenced by the temperature, i.e., the vibration of an atom is increased in proportion to the temperature, the excited energy is rapidly released, and thus, the light emitting time is rapidly reduced. Therefore, for example, an optical fiber (not shown) may be provided in the infrared passage 52 of the above-mentioned embodiment. Further, a thin fluorescent body is applied or adhered to the leading end of the optical fiber (near the wafer W). Then, the temperature of the wafer W may be measured from the decay time of the light emission by radiating the excitation light on the fluorescent body and monitoring the light emission intensity.

Further, in addition to the temperature measuring methods described above, the temperature of the wafer W may be measured, for example, by using a thermocouple, a thermistor or the like.

In the embodiment, the diagnosis program 3b is regularly executed, and the transition of the pressure value of the backside gas measured at that time is monitored to predict the end of the life span of the electrostatic chuck 34. However, if a certain recipe of the general operation program is executed many times, the transition of the pressure values of the backside gas measured during the general operation may be monitored in order to predict the residual life span of the electrostatic chuck. In this case, the life span of the electrostatic chuck 34 can be predicted without executing the diagnosis program 3b.

Now, as for the plasma processing, since the plasma tends to be concentrated on an angled portion rather than a planar portion, the plasma is concentrated more on the peripheral portion of the wafer W than on the center portion thereof. Therefore, the temperature at the peripheral portion of the wafer W tends to be higher than at the center portion thereof. For this reason, the above-mentioned backside gas may be preferably supplied to the peripheral portion and the center portion of the wafer W separately. By increasing the pressure of the backside gas supplied to the peripheral portion of the wafer W, the temperature can be uniformly maintained within the surface of the wafer W. One example of such configuration is schematically shown in FIG. 6.

Figure 6:
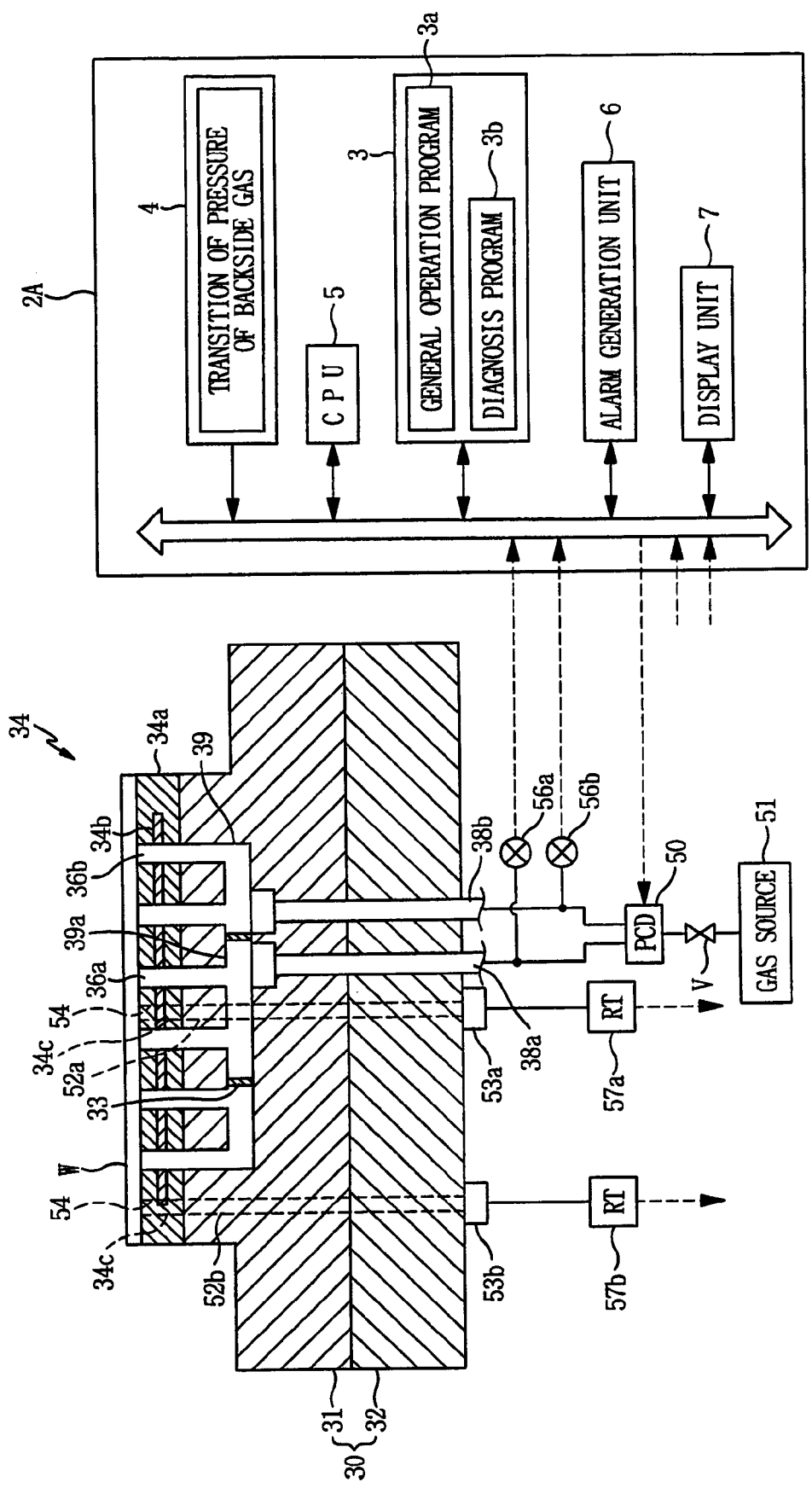
FIG. 6 is a diagram showing another exemplary control unit in accordance with the first embodiment of the present invention.

FIG. 6 shows an example in which, the backside gas is supplied to the center and the peripheral portion of the wafer W via through holes 36a and 36b based on detected pressure values of pressure detection units 56a and 56b under the control the pressure control device 50. Further, temperatures of the peripheral and the center portion of the wafer W are detected by detection ends 53a and 53b via infrared passages 52a and 52b. The temperatures and the pressures of the backside gas at the center and peripheral portion of the wafer W are transmitted to the control unit 2A and/or the storage unit 4; and then the pressures of the backside gas at the center and peripheral portion of the wafer W are regulated and the above-mentioned steps S51 through S57 are carried out. In this case, the gas chamber 39 has a partition 33 of a ring shape to separately supply the backside gas to the center portion and the peripheral portion of the wafer W. Further, as in FIG. 3, only some of the through holes 36a and 36b are illustrated in FIG. 6 for simplicity.

As described above, in case the pressure of the backside gas is low, the temperature of the wafer W is decreased a lot as the processing time lapses. Hence, as the number of processed wafers W increases, the temperature difference within the surface of the wafer W increases. However, as described above, since the pressure of the backside gas is controlled at the center portion and the peripheral portion of the wafer W separately, the occurrence of temperature difference within the surface of the wafer W can be suppressed, and the amount of pressure data is increased. As a result, the residual life span of the electrostatic chuck 34 can be predicted in a more reliable manner.

Further, in this embodiment, the pressures of the backside gas is separately controlled at center portion and peripheral portion of the wafer W. However, the wafer W may be divided into more than two portions, e.g., three portions in the diametrical direction thereof, and then the pressures of the backside gas at that portions may be separately controlled.

Second Embodiment

Figure 7:
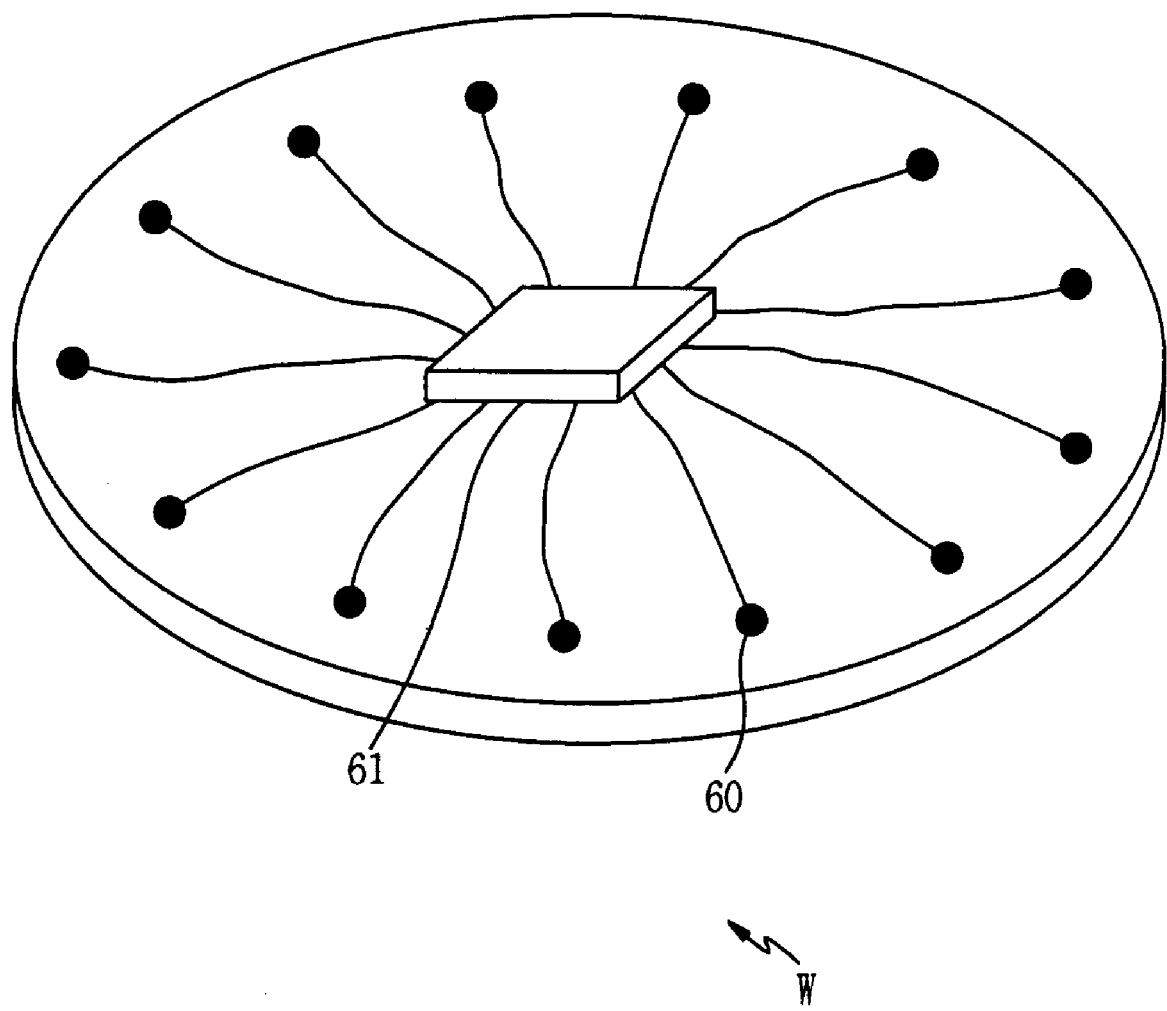
FIG. 7 is a perspective view showing an exemplary temperature detection unit in accordance with a second embodiment of the present invention.
Figure 8:
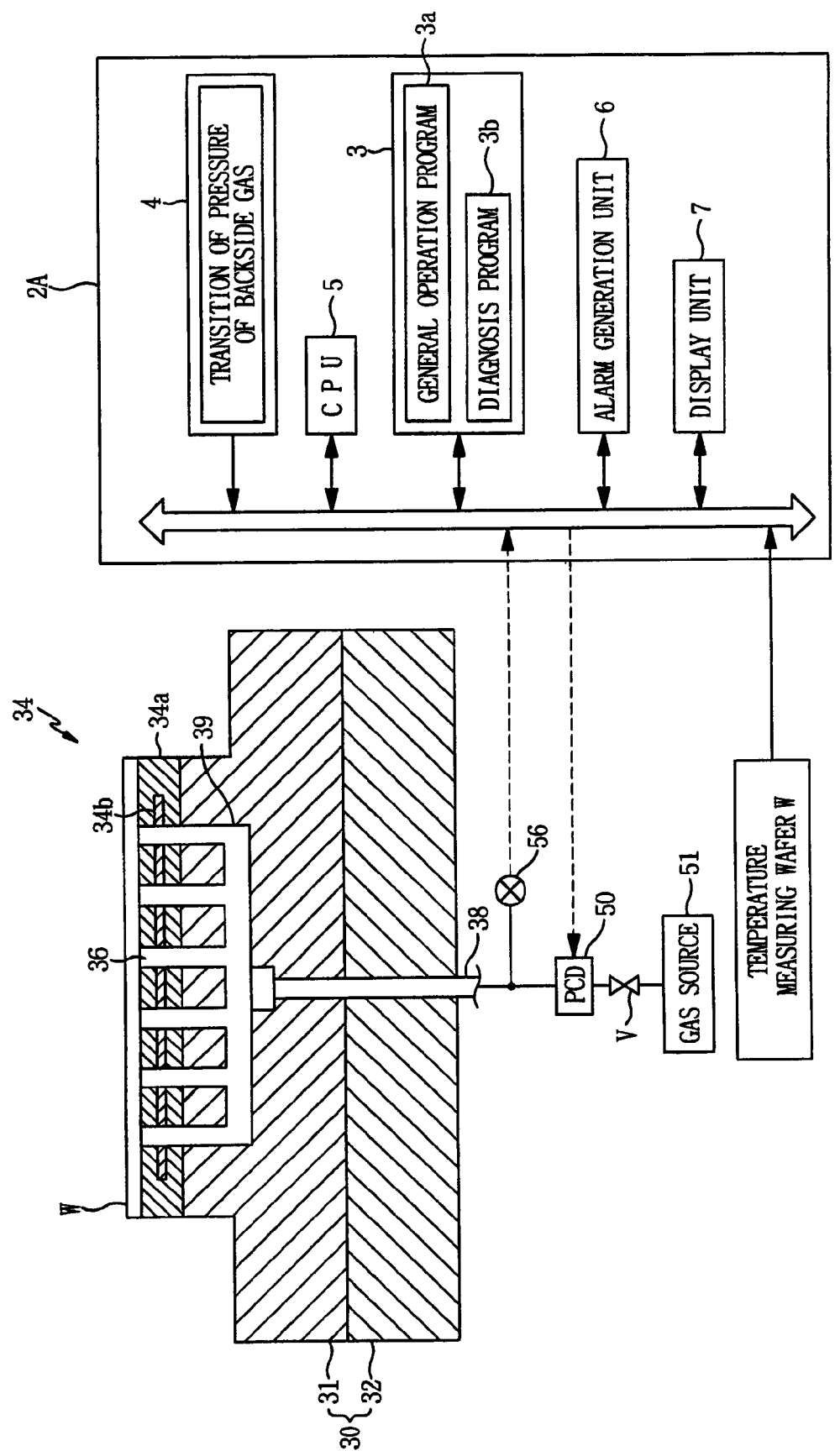
FIG. 8 is a diagram showing an exemplary control unit in accordance with the second embodiment of the present invention.
Figure 9:
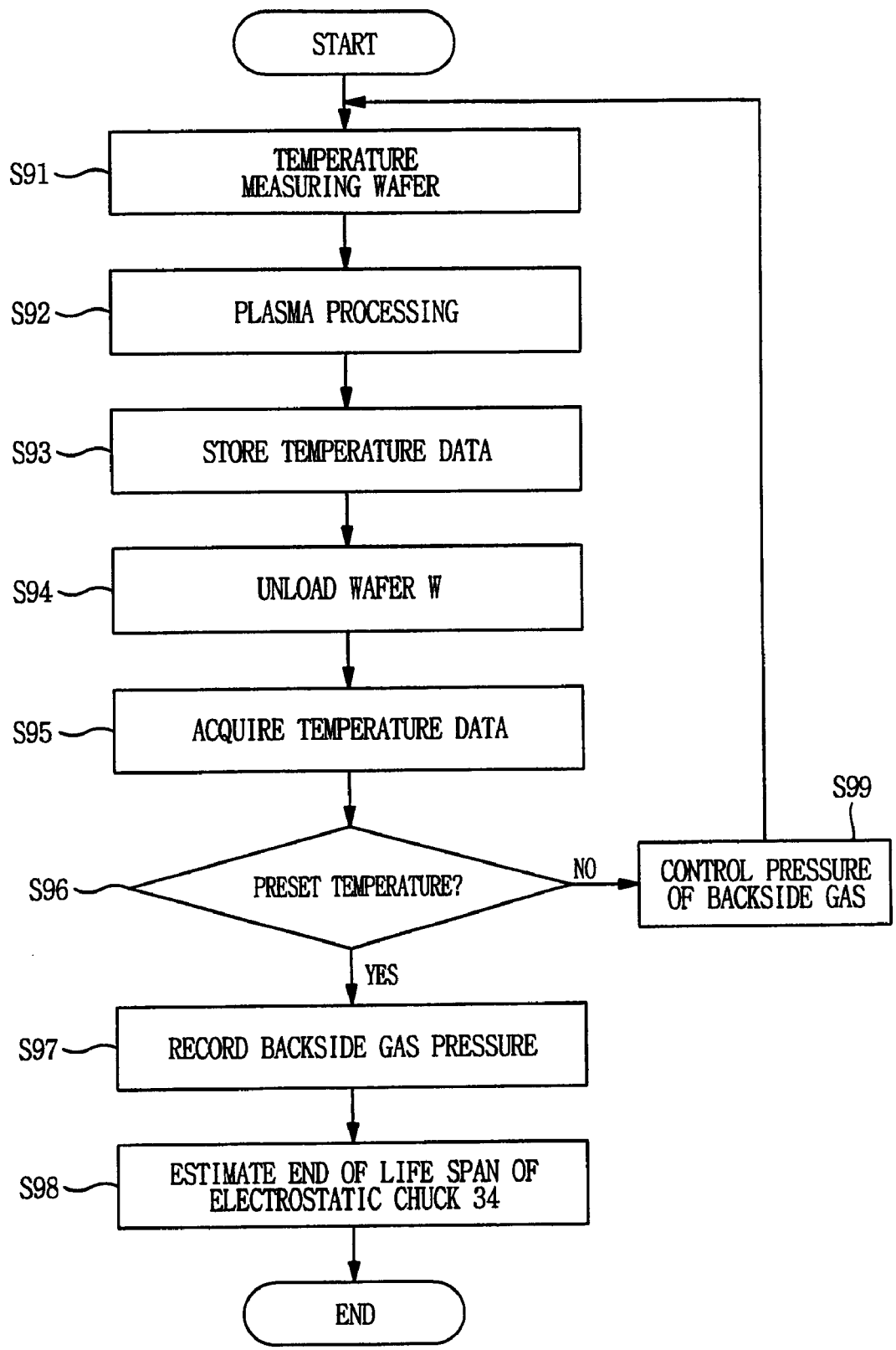
FIG. 9 is a flow chart for explaining a process flow in accordance with the second embodiment of the present invention.

Next, a second embodiment of the present invention will be described with reference to FIGS. 7 through 9. FIG. 7 shows a temperature measuring wafer W, which is configured as a temperature detection unit, i.e., a temperature detection device, such as a thermistor.

The temperature measuring wafer W is provided on a surface thereof with a plurality of temperature sensors 60, and a memory 61 for storing temperature data measured by the sensors 60. When the temperature measuring wafer W is plasma processed, the temperature of the wafer W during the plasma processing is measured. Then, the temperature during the plasma processing can be obtained by reading the temperature data from the memory 61.

In this embodiment, a vacuum processing apparatus 2 has almost the same configuration as that in FIG. 1 shown in the first embodiment. However, as shown in FIG. 8, the vacuum processing apparatus 2 does not include the infrared passage 52 and the detection end 53 because the temperature of the wafer W being plasma processed is measured by the temperature measuring wafer W.

Further, in this embodiment, the control unit 2A includes the program 3 having the general operation program 3a and the diagnosis program 3b. The general operation program 3a functions identically as that of the first embodiment. Since, however, the vacuum processing apparatus 2 is not provided with the radiation thermometer 57, the temperature of the wafer W being plasma processed is slowly decreased below the temperature prescribed by the recipe as the processing time increases.

Figure 4B:
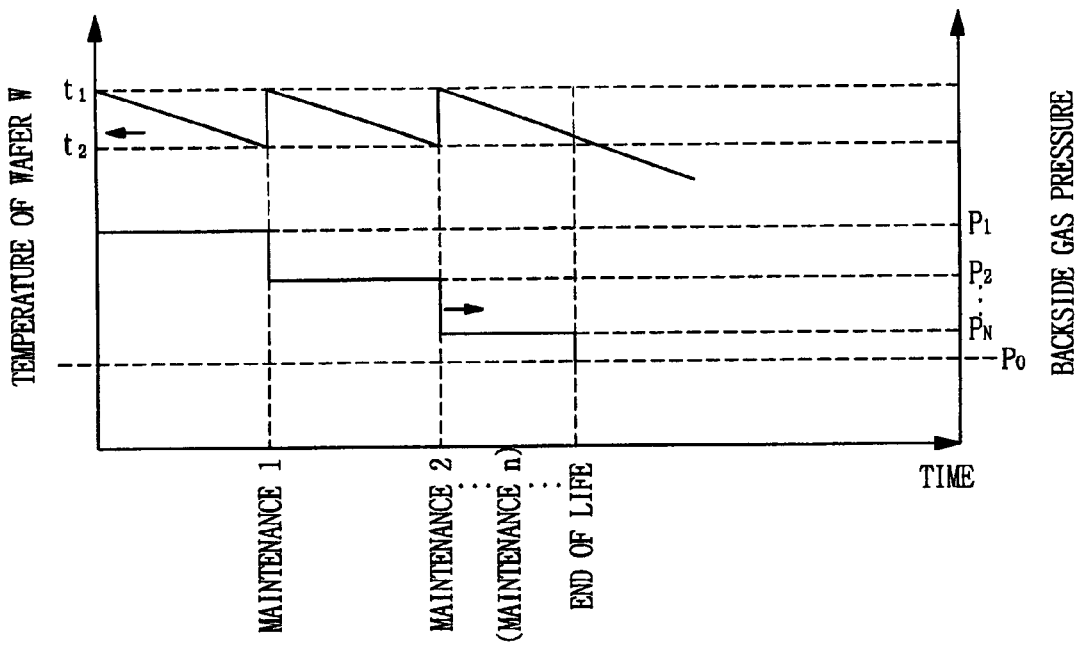
Figure 5:
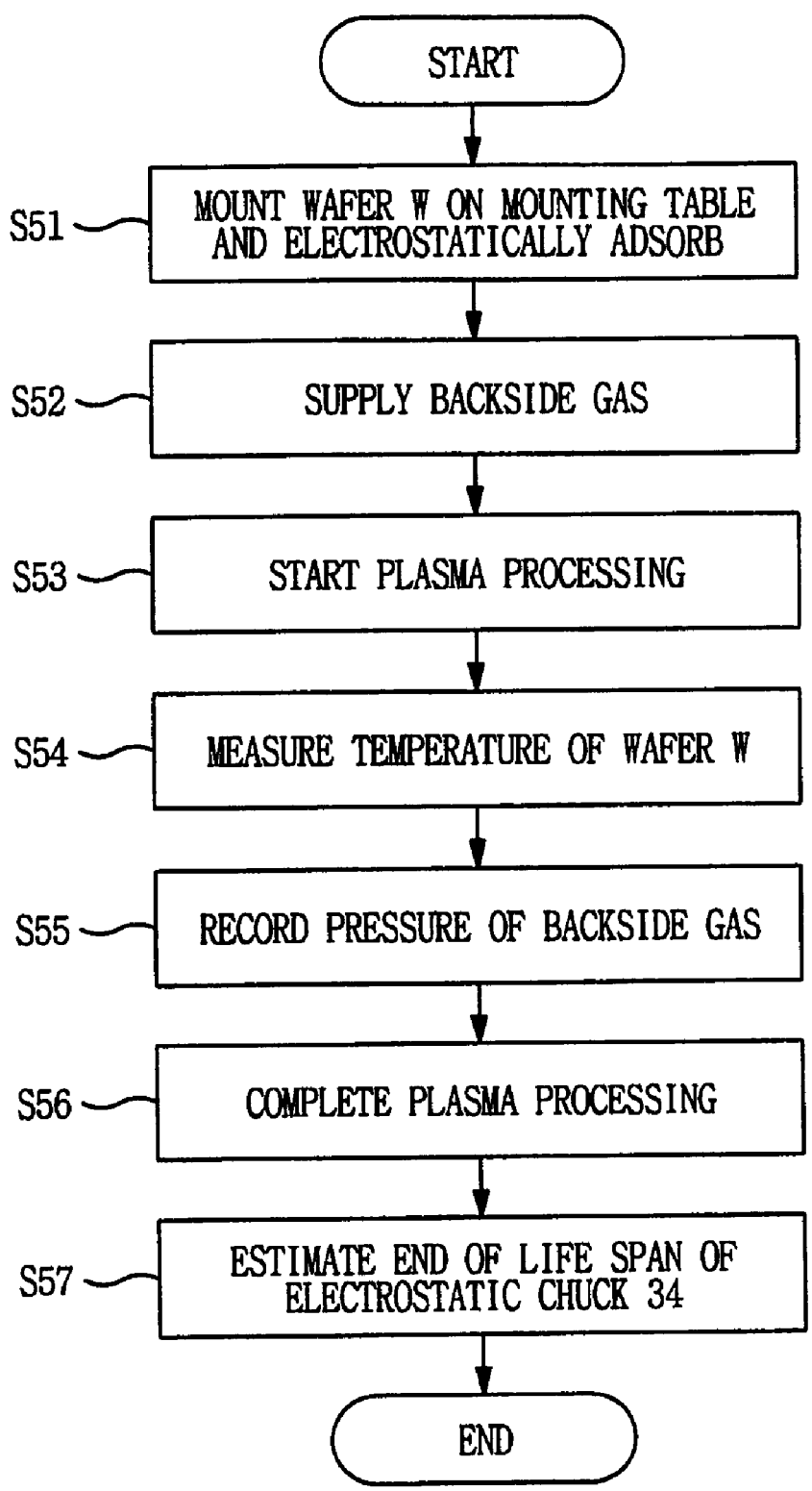
FIG. 5 is a flow chart explaining a process flow in accordance with the first embodiment of the present invention.

As in the first embodiment, the surface of the electrostatic chuck 34 is smoothed as the general operation program 3a is repeated several times. Therefore, the thermal conduction attributable to contact between the electrostatic chuck 34 and the wafer W is increased, and thus the temperature of the wafer W is decreased from an initial temperature t1 to t2, as shown in FIG. 4B.

Thereafter, for regular maintenance, the plasma processing of a standard recipe (recipe for diagnosis), which is part of the diagnosis program 3b, is performed on the temperature measuring wafer W. Further, the pressure of the backside gas is controlled (lowered) from P1 to P2 so that the temperature of the wafer W being processed returns to t1 from t2. The lowered pressure is stored in the storage unit 4.

The diagnosis program 3b is executed at a predetermined interval, and the temperature of the wafer W is adjusted from t2 to t1, while the pressure of the backside gas is regulated from P1, P2, . . . , Pn step by step. In this embodiment, since the time when the pressure of the backside gas reaches a regulable lower limit value P0 can be predicted, the end of the life span can be alarmed in advance, or a message that prompts the exchange of the electrostatic chuck 34 can be displayed, as described in the previous embodiment. In this embodiment, the residual life span of the electrostatic chuck 34 may be predicted by using an approximate expression derived from the obtained data, monitoring the difference from a threshold value or utilizing the pre-obtained data, as in the previous embodiment.

Further, in this embodiment, the diagnosis program 3b may have a function for correcting the pressure of the backside gas in the general operation program 3a. In other words, the correspondence relationship between a temperature correction value (the difference between t1 and t2) and the pressure regulation value of the backside gas (the difference between P1 and P2) in the standard recipe of the diagnosis program 3b can be used to estimate the corresponding relationship in another recipe executed in the general operation program 3a. That is, since the pressure of the change of the backside gas required in correcting the temperature of the wafer W in another recipe can be estimated, the diagnosis program 3b may be executed to correct the pressure of the backside gas of the general operation program 3a. Alternatively, the changed amount of pressure of the backside gas itself by the regulation in the diagnosis program 3b can be applied, without modification, to the regulation of pressure of the backside gas in the general operation program 3a.

Next, operations of the second embodiment will be described with reference to FIG. 9.

As described above, the general operation program 3a is repeated by predetermined times to the wafer W, and then the diagnosis program 3b is executed on the basis of the following steps.

(Step S91: Load a Temperature Measuring Wafer W)

The temperature measuring wafer W is mounted on the mounting table 30, and is electrostatically absorbed to the mounting table 30, same as the step S51 described in the first embodiment.

(Step S92: Perform Plasma Processing)

Next, the plasma processing is performed on the temperature measuring wafer W, as in the step S53 described in the first embodiment.

(Step S93: Accumulate Temperature Data)

The temperature of the wafer W being plasma processed is measured by the temperature sensors 60 provided on the temperature measuring wafer W, and is then stored in the memory 61.

(Step S94: Unload the Temperature Measuring Wafer W)

The wafer W is unloaded outside the processing vessel 21 along a path inverse to the path along which the wafer is loaded.

(Step S95: Obtain Temperature Data)

The temperature data stored in the memory 61 of the temperature measuring wafer W is read out and transmitted to the control unit 2A.

(Step S96: Check Temperature)

The temperature obtained in the step S95 is determined whether or not it is equal to the preset temperature. If the obtained temperature is not the preset temperature, the pressure of the backside gas is regulated to obtain the preset temperature (S99). Then the steps S91 to S96 are repeated and the obtained temperature is checked until the obtained temperature becomes the preset temperature (or until the obtained temperature falls within a preset temperature range). When the obtained temperature revealed to be the preset temperature, the following step S97 is carried out.

(Step S97: Record Pressure of Backside Gas)

As in step S55, the pressure of the backside gas, which is set in the step S99, is recorded in the storage unit 4. Further, as described above, the pressure of the backside gas obtained at this time is used to correct the pressure of the backside gas in the general operation program 3a, which is executed afterwards.

(Step S98: Predict End of Life Span of Electrostatic Chuck 34)

The end of the life span of the electrostatic chuck 34 is predicted from the transition of the recorded pressure of the backside gas as in step S57.

In accordance with the second embodiment of the present invention, the following effects can be obtained, in addition to the effects in the first embodiment. Specifically, modification of the apparatus to measure the temperature of the wafer W being plasma processed is not required, and the conventional temperature measuring wafer W can be used. Hence, the residual life span of the electrostatic chuck 34 can be easily predicted.

Further, in the step S96, the correlation between the temperature of the wafer W and the pressure of the backside gas can be obtained in advance. For example, in case the electrostatic chucks 34 have been exchanged several times, the previous data can be stored and the pressure of the backside gas can be determined from the correlation obtained from the previous data. In such a case, the backside gas is regulated in step S99, and then the subsequent step S97 is carried out without repeating steps S91 to S96.

In this embodiment, the backside gas may also be separately supplied to the center portion and peripheral portion of the wafer W via the through holes 36a and 36b based on the detected pressure values from the pressure detection units 56a and 56b as in FIG. 6. In this case, the temperature sensors 60 of the temperature measuring wafer W may be provided at the center and peripheral portions of the wafer W to measure the temperatures thereat.

Figure 10A:
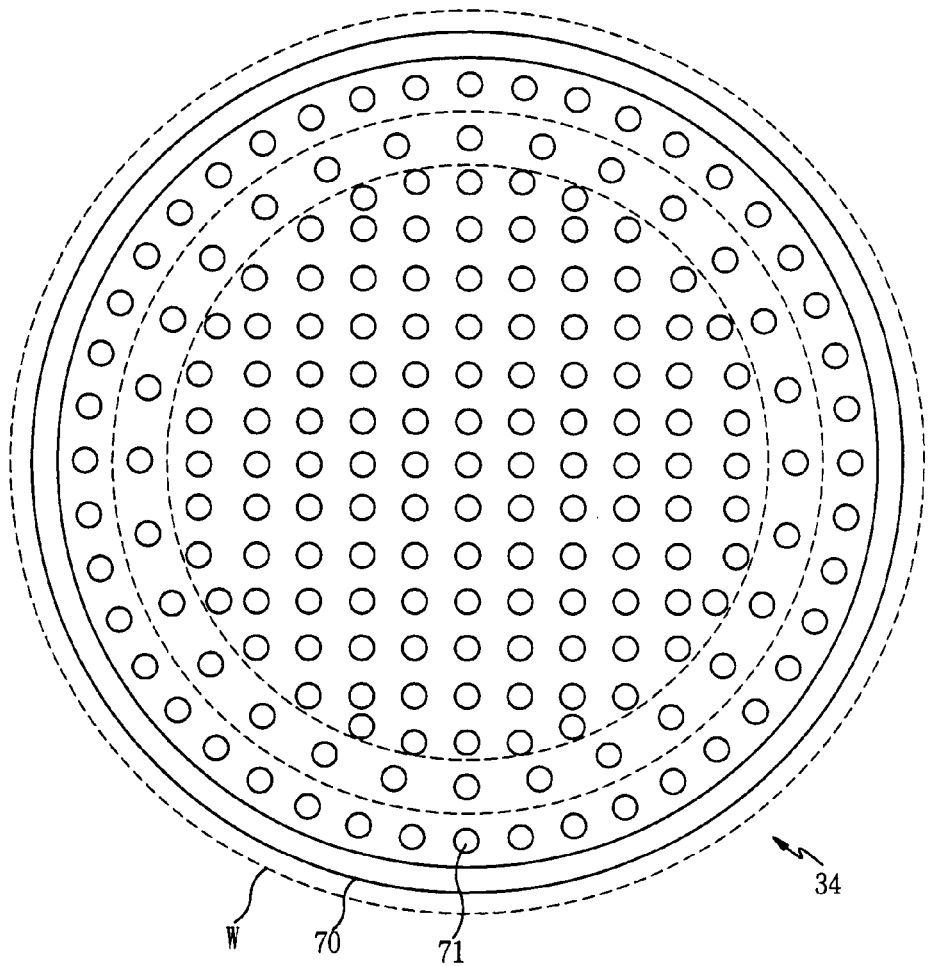
FIG. 10 is a diagram showing an exemplary surface structure of an electrostatic chuck in accordance with the present invention.
Figure 10B:
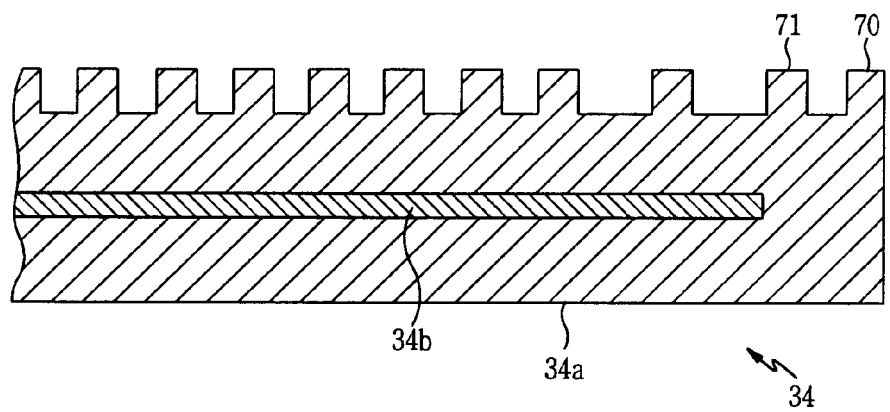

In the embodiments described above, the shape of the surface of the electrostatic chuck 34, as shown in FIG. 2, is a plane on a macroscopic scale, so that the backside gas flows through the minute gap between the electrostatic chuck 34 and the wafer W. However, as shown in FIG. 10, for example, the electrostatic chuck 34 may be provided, on the surface thereof, with an annular protrusion 70 having nearly the same diameter as that of the wafer W, and a plurality of columnar bodies 71 surrounded by annular protrusion 70 and having the same height as the annular protrusion 70. Therefore, the backside gas may flow between the columnar bodies 71. In this configuration, since the temperature of the wafer W is greatly cooled by the backside gas, the gradient of the decreasing pressure of the backside gas shown in FIG. 4A becomes small. In this electrostatic chuck 34, however, the residual life span thereof can also be predicted.

Further, powder used as a material of the insulating material 34a of the electrostatic chuck 34 can be thermally sprayed to form the surface of the electrostatic chuck 34. Thereafter, the surface may be polished by using a rubstone, or lapped by using an abrasive into which abrasive particles are suspended. In the electrostatic chuck 34 having such configuration, the residual life span thereof can also be predicted.

In the embodiments described above, the case in which the wafer W is heated by the plasma processing and is cooled by the backside gas as described. However, the present invention may be applied to a process other than the plasma processing, for example a process in which the temperature of the wafer W is increased as the processing is repeated. Further, the present invention may be equally applied to a process such as chemical vapor deposition (CVD), in which the wafer W is cooled by the process and is heated by the backside gas to control the temperature of the wafer W. In this case, as the number of processed wafers W increases, the temperature of the wafer W decreased. Hence, as the time elapses, the pressure of the backside gas is increased. Therefore, the residual life span of the electrostatic chuck 34 is set to the time, e.g., when the wafer W is broken due to excessively high pressure of the backside gas.

While the invention has been shown and described with respect to the embodiments, it is understood by those skilled in the art that various changes and modifications may be made without departing from the scope of the invention as defined in the following claims.

What is claimed is:

1. A method for diagnosing temporal deterioration of temperature controlling performance of an electrostatic chuck which is provided on a mounting table in a vacuum vessel and absorbs a substrate with an electrostatic force, the method comprising the steps of:
   (a) performing vacuum processings, wherein each vacuum processing is performed on a substrate absorbed by the electrostatic chuck, while a temperature control gas for controlling a temperature of the substrate is supplied between a rear surface of the substrate and a surface of the electrostatic chuck;
   (b) exposing, during the step (a), a substrate absorbed by the electrostatic chuck to an atmosphere generated by using a processing recipe for diagnosis, detecting a temperature of the substrate wherein, a pressure of the temperature control gas is controlled such that the detected temperature becomes a specific temperature, and the controlled pressure of the temperature control gas is stored in a storage unit; and
   (c) diagnosing the deterioration of the temperature controlling performance of the electrostatic chuck based on the pressure of the temperature control gas stored in the storage unit.

2. The method of claim 1, wherein the step (b) is repeatedly performed during the step (a).

3. The method of claim 2, wherein the step (c) is performed based on sequential pressure of the temperature control gas obtained by the repeatedly performed step (b).

4. The method of claim 1, wherein the step (c) includes a step of determining whether or not the controlled pressure of the temperature control gas is less than a threshold value.

5. The method of claim 1, wherein the substrate, to which the processing recipe for diagnosis is applied, is a substrate for maintenance.

6. The method of claim 1, wherein the temperature of the substrate is detected by a temperature detection unit provided at the mounting table.

7. The method of claim 1, wherein the substrate employed in the step (b) includes a temperature detection unit detecting the temperature of the substrate.

8. The method of claim 7, wherein the detected temperature by the temperature detection unit is obtained after the substrate is unloaded from the vacuum vessel, and if the obtained temperature of the substrate is different from the specific temperature, newly detected temperature of the substrate is obtained by changing the pressure of the temperature control gas and exposing the substrate to the atmosphere generated by using the processing recipe for diagnosis again.

9. The method of claim 1, wherein the vacuum processing uses a plasma processing.

10. The method of claim 1, wherein the surface of the electrostatic chuck is formed by polishing thermally sprayed powder of a dielectric material.

11. The method of claim 1, wherein the surface of the electrostatic chuck includes an annular protrusion which has almost same diameter as that of the substrate mounted on the electrostatic chuck and a plurality of columnar bodies surrounded by the protrusion and having the same height as the protrusion, so that the backside gas flows between the columnar bodies surrounded by the protrusion.

12. A vacuum processing apparatus which performs a vacuum processing on a substrate absorbed by an electrostatic chuck provided on a mounting table in a vacuum vessel, while a temperature control gas for controlling a temperature of the substrate is supplied between a rear surface of the substrate and a surface of the electrostatic chuck, the vacuum processing apparatus comprising:
   a temperature detection unit for detecting the temperature of the substrate;
   a pressure detection unit for detecting a pressure of the temperature control gas;
   a pressure control unit for controlling the pressure of the temperature control gas;
   a storage unit for storing detected pressure values from the pressure detection unit;
   executing unit, being executed between the vacuum processing, which is performed sequentially on a plurality of substrates, for exposing the substrate absorbed by the electrostatic chuck to an atmosphere generated by using a processing recipe for diagnosis, detecting a temperature of the substrate, wherein a pressure of the temperature control gas is controlled such that the detected temperature at the temperature detection unit becomes a specific temperature, and the controlled pressure from the pressure detection unit is stored in a storage unit; and
   diagnosing unit for diagnosing deterioration of temperature controlling performance of the electrostatic chuck based on the detected pressure of the temperature control gas stored in the storage.

13. The apparatus of claim 12, wherein the substrate, to which the processing recipe for diagnosing is applied, is a substrate for maintenance.

14. The apparatus of claim 12, wherein the diagnosing unit diagnoses the deterioration of the temperature controlling performance of the electrostatic chuck based on sequential pressure data of the temperature control gas obtained during the vacuum processing.

15. The apparatus of claim 12, wherein the diagnosing unit includes means for determining whether or not the pressure of the temperature control gas is less than a threshold value.

16. A storage medium, which stores a program used in a vacuum processing apparatus performing vacuum processing on a substrate while the substrate is absorbed by an electrostatic chuck provided on a mounting table in a vacuum vessel, wherein the program comprises steps of performing the method of claim 1.

* * * * *